United States Patent
An et al.

(10) Patent No.: US 10,375,840 B2
(45) Date of Patent: Aug. 6, 2019

(54) TRANSPARENT DISPLAY DEVICE

(71) Applicant: LG ELECTRONICS INC., Seoul (KR)

(72) Inventors: Jaeho An, Seoul (KR); Jongmin Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 14 days.

(21) Appl. No.: 15/500,015

(22) PCT Filed: Feb. 5, 2015

(86) PCT No.: PCT/KR2015/001168
§ 371 (c)(1),
(2) Date: Jan. 27, 2017

(87) PCT Pub. No.: WO2016/017882
PCT Pub. Date: Feb. 4, 2016

(65) Prior Publication Data
US 2017/0257956 A1    Sep. 7, 2017

(30) Foreign Application Priority Data
Jul. 28, 2014  (KR) ........................ 10-2014-0095525

(51) Int. Cl.
*H05K 5/00* (2006.01)
*G06F 9/00* (2006.01)
(Continued)

(52) U.S. Cl.
CPC .......... *H05K 5/0017* (2013.01); *A47F 3/005* (2013.01); *A47F 3/0434* (2013.01);
(Continued)

(58) Field of Classification Search
None
See application file for complete search history.

(56) References Cited

U.S. PATENT DOCUMENTS 8,683,745 B2 * 4/2014 Artwohl ............... A47F 3/0434
49/70
9,052,536 B2 * 6/2015 Artwohl ............... A47F 3/0434
(Continued)

FOREIGN PATENT DOCUMENTS

CN    103282951    9/2013
CN    103440822    12/2013
(Continued)

OTHER PUBLICATIONS

PCT International Application No. PCT/KR2015/001168, Written Opinion of the International Searching Authority dated May 12, 2015, 24 pages.
(Continued)

*Primary Examiner* — Courtney L Smith
*Assistant Examiner* — Rashen E Morrison
(74) *Attorney, Agent, or Firm* — Lee, Hong, Degerman, Kang & Waimey PC

(57) ABSTRACT

Disclosed in the present invention is a transparent display device. The transparent display device according to the present invention comprises: a frame having first and second apertures; a transparent display panel disposed on the first aperture of the frame; and a control module, disposed on the second aperture of the frame, for controlling the transparent display panel, wherein the frame is installed to cover the front surface of the door unit of a certain product or is separated from the front surface of the door unit of the certain product, and wherein an extension frame extended from an edge of the frame toward the door unit of the certain product can engage with the side of the edge of the door unit of the certain product.

19 Claims, 8 Drawing Sheets

(51) Int. Cl.

| | | |
|---|---|---|
| *A47F 3/00* | (2006.01) | |
| *A47F 3/04* | (2006.01) | |
| *G06F 3/042* | (2006.01) | |
| *G09F 9/30* | (2006.01) | |
| *G09F 23/00* | (2006.01) | |
| *H05K 5/03* | (2006.01) | |
| *G09F 9/35* | (2006.01) | |
| *G09F 23/06* | (2006.01) | |

(52) U.S. Cl.
CPC .............. *G06F 3/0421* (2013.01); *G06F 9/00* (2013.01); *G09F 9/30* (2013.01); *G09F 9/35* (2013.01); *G09F 23/00* (2013.01); *G09F 23/065* (2013.01); *H05K 5/03* (2013.01); *G09F 2023/0033* (2013.01)

(56) References Cited

U.S. PATENT DOCUMENTS

| | | | | |
|---|---|---|---|---|
| 2008/0024047 | A1* | 1/2008 | Juo | A47F 3/043 312/405 |
| 2009/0244884 | A1* | 10/2009 | Trulaske, Sr. | A47F 3/001 362/94 |
| 2010/0180615 | A1* | 7/2010 | Linder | A47F 3/0434 62/248 |
| 2011/0181792 | A1* | 7/2011 | Hammonds | A47F 11/06 348/745 |
| 2012/0105424 | A1* | 5/2012 | Lee | G09F 9/35 345/212 |
| 2013/0063326 | A1* | 3/2013 | Riegel | G09F 9/33 345/4 |
| 2013/0271696 | A1* | 10/2013 | Dunn | G09F 23/06 349/58 |
| 2014/0078407 | A1* | 3/2014 | Green | G09F 9/35 348/836 |
| 2014/0144083 | A1* | 5/2014 | Artwohl | A47F 3/0434 49/70 |
| 2014/0232958 | A1* | 8/2014 | Venturas | G02F 1/133308 349/12 |
| 2016/0095450 | A1* | 4/2016 | Trulaske, Sr. | A47F 11/10 312/116 |

FOREIGN PATENT DOCUMENTS

| | | |
|---|---|---|
| CN | 103676366 | 3/2014 |
| CN | 103745665 | 4/2014 |
| JP | 2010072600 | 4/2010 |
| KR | 1020120044874 | 5/2012 |
| KR | 101161114 | 6/2012 |
| KR | 1020140029196 | 3/2014 |
| WO | 2013134304 | 9/2013 |

OTHER PUBLICATIONS

European Patent Office Application Serial No. 15827971.1, Search Report dated Mar. 7, 2018, 8 pages.
The State Intellectual Property Office of the People's Republic of China Application No. 201580040867.2, Office Action dated Jan. 11, 2019, 10 pages.

* cited by examiner

TRANSPARENT DISPLAY DEVICE

CROSS-REFERENCE TO RELATED APPLICATIONS

This application is the National Stage filing under 35 U.S.C. 371 of International Application No. PCT/KR2015/001168, filed on Feb. 5, 2015, which claims the benefit of earlier filing date and right of priority to Korean Patent Application No. 10-2014-0095525, filed on Jul. 28, 2014, the contents of which are all hereby incorporated by reference herein in their entirety.

TECHNICAL FIELD

The present invention relates to a transparent display device, and more particularly, to a transparent display device configured to display information, advertisement and the like of goods in a product by being detachably attached to a prescribed product.

BACKGROUND ART

Various display devices are currently developed owing to the ongoing developments of the electronic technology. Display devices containing various display parts such as CRT, LCD, PDP, OLED and the like have been used or are being used.

Yet, the existing display devices have limitation put on being viewable only in one direction having a display unit disposed therein.

To overcome such limitation, the study for a transparent display device is in progress.

Since a display unit of a transparent display device is transparent, a user can advantageously view a subject behind the display unit together with a content displayed on the display unit.

And, a third party user located opposite to the user can advantageously view the content displayed on the display unit as well.

However, the study for the transparent display device is focused on hardware development only. And, the study for utilization and content development is still insufficient.

Accordingly, the demand for the development of a transparent display device capable of performing various functions such as information of goods in a product, advertisement of the goods and the like by being detachably attached to a door unit of a prescribed product is increasingly rising.

DISCLOSURE OF THE INVENTION

Technical Tasks

One technical task of the present invention is to provide a transparent display device capable of simple installation and separation of a display device, facilitation of part replacement and mass production by detachably attaching a frame having a transparent display panel and control module disposed thereon to a front surface of a door unit of a prescribed product.

Another technical task of the present invention is to provide a transparent display device having excellent advertisement and public relations effects of goods within a transparent display device installed product by displaying information and images (photos, videos, etc.) related to the goods.

Technical tasks obtainable from the present invention are non-limited by the above-mentioned technical task. And, other unmentioned technical tasks can be clearly understood from the following description by those having ordinary skill in the technical field to which the present invention pertains.

Technical Solutions

In one technical aspect of the present invention, provided herein is a transparent display device, including a frame including a first opening and a second opening, a transparent display panel disposed on the first opening of the frame, and a control module controlling the transparent display panel by being disposed on the second opening of the frame, wherein the frame is installed to cover a front surface of a door unit of a prescribed product or separated from the front surface of the door unit of the prescribed product and wherein an extending frame extending from a rim of the frame in a direction of the door unit of the prescribed product and a lateral surface of a rim of the door unit of the prescribed product are jointed together.

Preferably, a transparent cover may be disposed in front of the first opening of the frame and a non-transparent cover may be disposed in front of the second opening of the frame.

More preferably, a rear surface of the transparent cover may come into contact with a front surface of the transparent display panel.

More preferably, an anti-reflective (AR) coating layer may be formed on a front surface of the transparent cover.

Preferably, an airgap may be formed between a rear surface of the transparent display panel and the front surface of the door unit of the prescribed product.

Preferably, the frame may include an inner frame coming into contact with the rim of the door unit of the prescribed product and an outer frame disposed in a manner of being spaced apart from the inner frame.

Preferably, the control module may control the transparent display panel to display information related to goods stored in the door unit of the prescribed product.

Technical tasks obtainable from the present invention are non-limited by the above-mentioned technical task. And, other unmentioned technical tasks can be clearly understood from the following description by those having ordinary skill in the technical field to which the present invention pertains.

ADVANTAGEOUS EFFECTS

According to one embodiment of the present invention, simple installation and separation of a display device, facilitation of part replacement and mass production can be achieved by detachably attaching a frame having a transparent display panel and control module disposed thereon to a front surface of a door unit of a prescribed product.

Moreover, the present invention can achieve excellent advertisement and public relations effects of goods within a transparent display device installed product by displaying information and images (photos, videos, etc.) related to the goods.

Effects obtainable from the present invention are non-limited by the above mentioned effect. And, other unmentioned effects can be clearly understood from the following description by those having ordinary skill in the technical field to which the present invention pertains.

BEST MODE FOR INVENTION

Reference will now be made in detail to the preferred embodiments of the present invention, examples of which are illustrated in the accompanying drawings.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

In the following detailed description of the invention includes details to help the full understanding of the present invention. Yet, it is apparent to those skilled in the art that the present invention can be implemented without these details. And, the present invention may be non-limited by the preferred embodiments of the present invention.

Although terminologies used in the present specification are selected from general terminologies used currently and widely in consideration of functions in the present invention, they may be changed in accordance with intentions of technicians engaged in the corresponding fields, customs, advents of new technologies and the like. Occasionally, some terminologies may be arbitrarily selected by the applicant(s). In this case, the meanings of the arbitrarily selected terminologies shall be described in the corresponding part of the detailed description of the invention. Therefore, terminologies used in the present specification need to be construed based on the substantial meanings of the corresponding terminologies and the overall matters disclosed in the present specification rather than construed as simple names of the terminologies.

Figure 1:
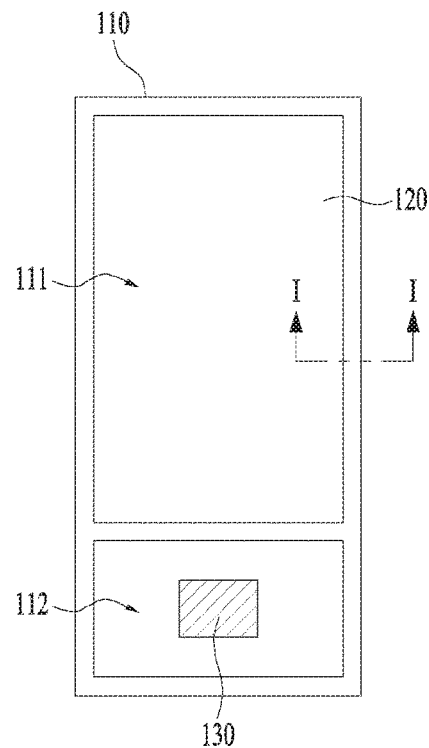
FIG. 1 is a front diagram to illustrate a transparent display device according to the present invention.

FIG. 1 is a front diagram to illustrate a transparent display device according to the present invention. And, FIG. 2 is a cross-sectional diagram according to a line I-I shown in FIG. 1.

Figure 2:
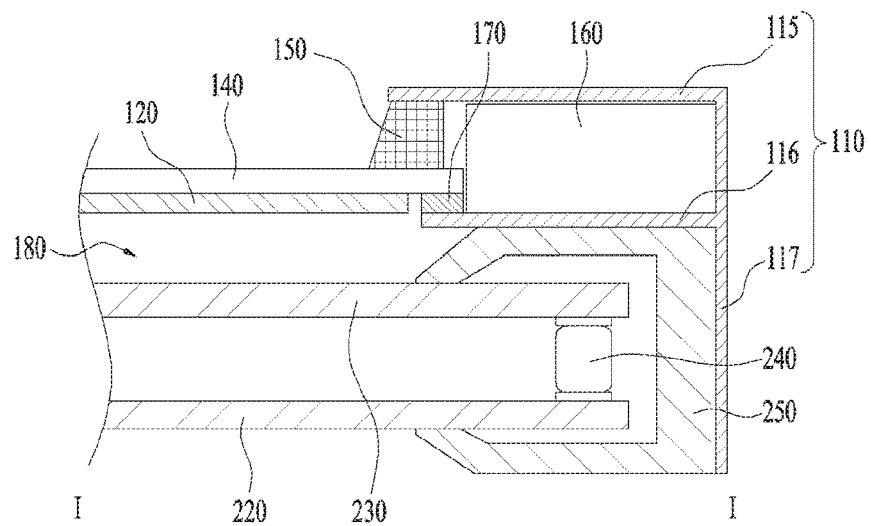
FIG. 2 is a cross-sectional diagram according to a line I-I shown in FIG. 1.

Referring to FIG. 1 and FIG. 2, a transparent display device may include a frame 110 including a first opening 111 and a second opening 112, a transparent display panel 120 disposed in the first opening 111 of the frame 110, and a control module 130 disposed in the second opening 112 of the frame 110 to control the transparent display panel 120.

Herein, a size of the first opening 111 of the frame 110 may be different from that of the second opening 112.

For instance, a size of the first opening 111 of the frame 110 may be greater than that of the second opening 112.

The reason for this is that the transparent display panel 120 and the control module 130 for controlling the transparent display panel 120 are disposed in the first opening 111 and the second opening 112 of the frame 100, respectively.

In some cases, a size of the first opening 111 of the frame 110 may be equal to that of the second opening 112.

Herein, since the size of the first opening 111 of the frame 110 is a region for disposing the transparent display panel 120 therein, it may vary according to a size of the transparent display panel 120.

And, the size of the first opening 111 of the frame 110 may vary according to a door size of a product in which a transparent display device will be installed.

In some cases, according to a shape of a door of a product in which the transparent display device will be installed, locations of the first and second openings 111 and 112 of the frame 110 may be switched to each other.

For instance, with respect to the transparent display device, the first opening 111 of the frame 110 in which the transparent display panel 120 is disposed may be located at a top end of a door of a product to be installed, and the second opening 112 of the frame 110 in which the control module 130 is disposed may be located at a bottom end of the door of the product to be installed.

Alternatively, with respect to the transparent display device, the first opening 111 of the frame 110 in which the transparent display panel 120 is disposed may be located at a bottom end of a door of a product to be installed, and the second opening 112 of the frame 110 in which the control module 130 is disposed may be located at a top end of the door of the product to be installed.

Alternatively, with respect to the transparent display device, the first opening 111 of the frame 110 in which the transparent display panel 120 is disposed may be located at a right side of a door of a product to be installed, and the second opening 112 of the frame 110 in which the control module 130 is disposed may be located at a left side of the door of the product to be installed.

Alternatively, with respect to the transparent display device, the first opening 111 of the frame 110 in which the transparent display panel 120 is disposed may be located at a left side of a door of a product to be installed, and the second opening 112 of the frame 110 in which the control module 130 is disposed may be located at a right side of the door of the product to be installed.

Subsequently, a transparent cover 140 may be disposed in front of the first opening 111 of the frame 110 and a non-transparent or transparent cover may be disposed in front of the second opening 112 of the frame 110.

Herein, the transparent cover 140 may include tempered glass capable of protecting the transparent display panel 120.

And, a rear surface of the transparent cover 140 may come into contact with a front surface of the transparent display panel 120.

In some cases, the rear surface of the transparent cover 140 may be disposed in a manner of being spaced apart from the front surface of the transparent display panel 120.

Herein, the transparent display panel 120 may include at least one of a liquid crystal display (LCD), a thin film transistor-liquid crystal display (TFT LCD), an organic light-emitting diode (OLED), a flexible display, and a 3D display, and have a configuration of a transparent or light-transmissive type in order for a user to view a scene in rear of the transparent display panel 120.

For one representative example of the transparent display panel 120, there is TOLED (transparent OLED) or the like and a rear structure of the transparent display panel 120 may have a light-transmissive structure as well. Owing to such a structure, a user can view an object or thing located in rear of the transparent display device through a region occupied by the transparent display panel 120.

According to an implementation type, the transparent display device may include two or more transparent display panels 120. For instance, a plurality of the transparent display panels 120 may be disposed in a manner of being spaced apart from each other or formed integrally in a single plane, or may be disposed in different planes, respectively.

In case that the transparent display panel 120 and a touch sensor mutually configure a layered structure or are formed integrally, the transparent display panel 120 may be used as an input device as well as an output device.

Herein, if the touch sensor has a configuration of one of a touch film, a touch sheet, a touch pad and the like for example, the touch sensor can configure the layered structure by being stacked on the transparent display panel 120 or may be integrally formed by being included in the configuration of the transparent display panel 120.

A transparent adhesive may be disposed between the rear surface of the transparent cover 140 and the transparent display panel 120. For instance, the transparent adhesive may be disposed on a front edge of the transparent display panel 120.

In some cases, alternatively, the transparent adhesive may be disposed on the whole front surface of the transparent display panel 120.

In doing so, a thickness of the transparent adhesive may be smaller than that of the transparent display panel 120.

And, an anti-reflective (AR) coating layer may be formed on the front surface of the transparent cover 140.

The reason for this is that if the transparent cover 140 reflects an external light, luminance and contrast for an image displayed on the transparent display panel 120 may be lowered.

Moreover, an airgap 180 may be formed between the rear surface of the transparent display panel 120 and a front surface of a door unit of a prescribed product.

The reason for this is described as follows. First of all, since humidity increases due to a temperature difference between the transparent display panel 120 and the door unit of the product, it may degrade the transparent display panel 120. If so, the durability of the transparent display panel 120 may be degraded.

For instance, if a product in which a transparent display device will be installed is a cooler, a door of the cooler may have a dual door structure.

Namely, the door of the cooler may have a structure in which a front door 230 and a rear door 220 are disposed in a manner of being evenly spaced apart from each other and can be attached to a support 240, which is disposed in-between, through an adhesive.

And, a cooler door frame 250 may be disposed on a door edge of the cooler.

Herein, a first gap between the rear surface of the transparent display panel 120 and the front surface of the door unit of the prescribed product may be smaller than a second gap between the front door 230 and the rear door 220 of the cooler door.

In some cases, the first gap and the second gap may be equal to each other.

In some other cases, the first gap may be greater than the second gap.

Thus, the first gap between the rear surface of the transparent display panel 120 and the front surface of the door unit of the prescribed product may be variable according to a humidity level within the airgap.

For instance, a gap adjusting unit (not shown) configured to adjust the first gap between the rear surface of the transparent display panel 120 and the front surface of the door unit of the prescribed product may be disposed in the frame 110.

The gap adjusting unit may include an adjusting plate extending from a rim of the frame 110 in a direction of the first opening 111 and a hinge configured to connect the adjusting plate and the frame 110 and rotate the adjusting plate in a direction of the door unit of the prescribed product.

Herein, in response to a control signal of the control module 130, the gap adjusting unit can adjust the first gap between the rear surface of the transparent display panel 120 and the front surface of the door unit of the prescribed product.

For instance, a humidity sensor configured to sense humidity within the airgap 180 may be disposed in the frame 110. And, the control module 130 can control the gap adjusting unit by receiving a sensing signal of the humidity sensor.

Namely, if the humidity within the airgap 180 is high, the controller module 130 controls the gap adjusting unit to increase the first gap. If the humidity within the airgap 180 is low, the controller module 130 controls the gap adjusting unit to decrease the first gap.

Therefore, the present invention prevents the transparent display panel 120 from being adversely affected by humidity, thereby enhancing durability.

In some cases, a ventilating unit (not shown) configured to discharge heat generated from the control module 130 into the space between the rear surface of the transparent display panel 120 and the front surface of the door unit of the prescribed product may be disposed in the second opening 112 of the frame 110.

Herein, the ventilating unit enables air with heat to flow into the space between the rear surface of the transparent display panel 120 and the front surface of the door unit of the prescribed product, thereby removing humidity within the airgap 180.

For instance, a humidity sensor configured to sense humidity within the airgap 180 may be disposed in the frame 110. The control module 130 can control the ventilating unit by receiving a sensing signal of the humidity sensor.

Therefore, the present invention prevents the transparent display panel 120 from being adversely affected by humidity, thereby enhancing durability.

Meanwhile, the frame 100 may include an inner frame 116 coming into contact with the rim of the door unit of the prescribed product and an outer frame 115 disposed by being spaced apart from the inner frame 116.

Herein, the inner frame 116 is attached to the rim of the transparent cover 140 configured to cover the first opening 111 and the outer frame 115 may be spaced apart from the transparent cover 140.

In this case, an IR (infrared) touch sensor 150 is disposed between the outer frame 115 and the transparent cover 140, thereby sensing a user's touch.

In some cases, an adhesive layer or supporter may be disposed between the outer frame 115 and the transparent cover 140.

And, a wiring 160 configured to electrically connect the control module 130 and the transparent display panel 120 may be disposed between the inner frame 116 and the outer frame 115.

Namely, by disposing the wiring 160 in a space between the inner frame and the outer frame 115, the space can be used efficiently.

The frame 110 including the inner frame 116 and the outer frame 115 may further include an extending frame 117 extending from end portions of the inner and outer frames 116 and 115 in a direction of the door unit of the prescribed product.

Herein, the extending frame 117 comes into contact with a lateral surface of the cooler door frame 250 of the door unit and can be then jointed by a joint part such as a joint screw or the like.

In order to display information related to goods stored in the door unit of the prescribed product, the control module 130 can control the transparent display panel 120.

In some cases, the control module 130 may control the transparent display panel 120 to simultaneously display a transmissive region for transmitting light and a non-transmissive region for not transmitting light.

In doing so, the control module 130 may control the transparent display panel 120 to display the information on the goods stored in the door unit of the prescribed product on the non-transmissive region.

In some cases, the control module 130 may control the transparent display panel 120 to display information related to goods viewable through the transmissive region among the goods stored in the door unit of the prescribed product.

Figure 3:
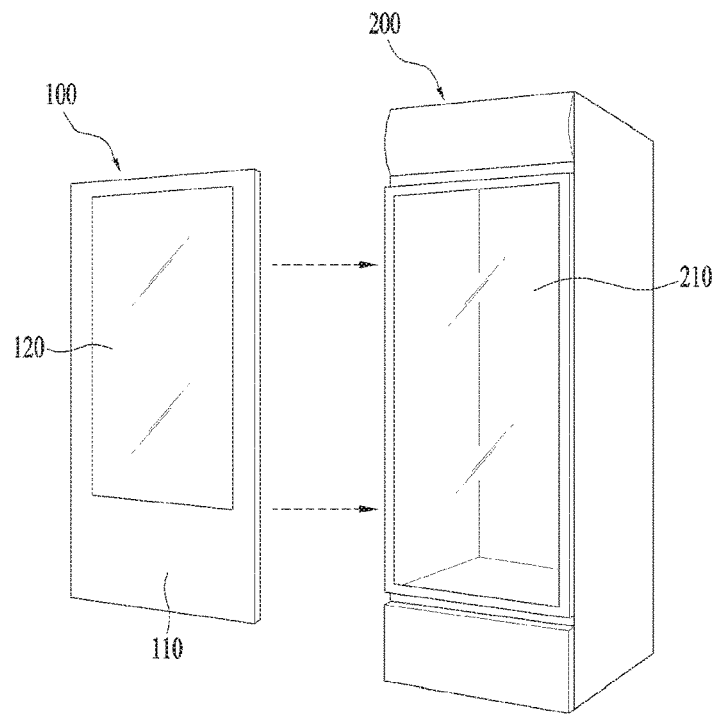
FIG. 3 is a diagram to illustrate a situation before a transparent display device according to the present invention is installed on a door of a prescribed product.
Figure 4:
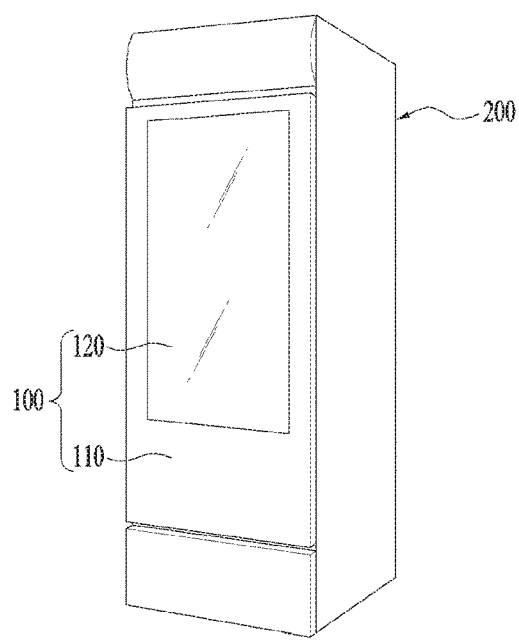
FIG. 4 is a diagram to illustrate a situation after a transparent display device according to the present invention has been installed on a door of a prescribed product.

FIG. 3 is a diagram to illustrate a situation before a transparent display device according to the present invention is installed on a door of a prescribed product. FIG. 4 is a diagram to illustrate a situation after a transparent display device according to the present invention has been installed on a door of a prescribed product.

Referring to FIG. 3 and FIG. 4, a display device 100 according to the present invention may include a frame 110 in which a transparent display panel 120 and a control module 130 are installed. And, the frame 110 of the display device 100 may be installed on a front surface of a door unit 210 of a product 200 such as a cooler or the like.

Herein, the frame 110 may be installed to cover a front surface of the door unit 210 of the prescribed product 200, or can be separated from the front surface of the door unit 210 of the prescribed product 200.

Herein, an extending frame (denoted by 117 in FIG. 2) extending from a rim of the frame 110 in a direction of the door unit 210 of the prescribed product 200 and a lateral surface of a rim of the door unit 210 of the prescribed product 200 can be jointed.

For instance, the transparent display device 100 may be jointed with the door unit of the product 200 (e.g., cooler, etc.) by various joint mechanisms.

Herein, the joint mechanisms may include a mechanism of fixing using a joint bold, a mechanism of jointing by forming a joint recess and a joint projection.

Therefore, according to the present invention, the frame 110 in which the transparent display panel 120 and the control module are installed is attached to or detached from the front surface of the door unit 210 of the prescribed product 200. Therefore, the transparent display device 100 can be simply installed or uninstalled, parts can be easily replaced, and mass production is available.

Figure 5:
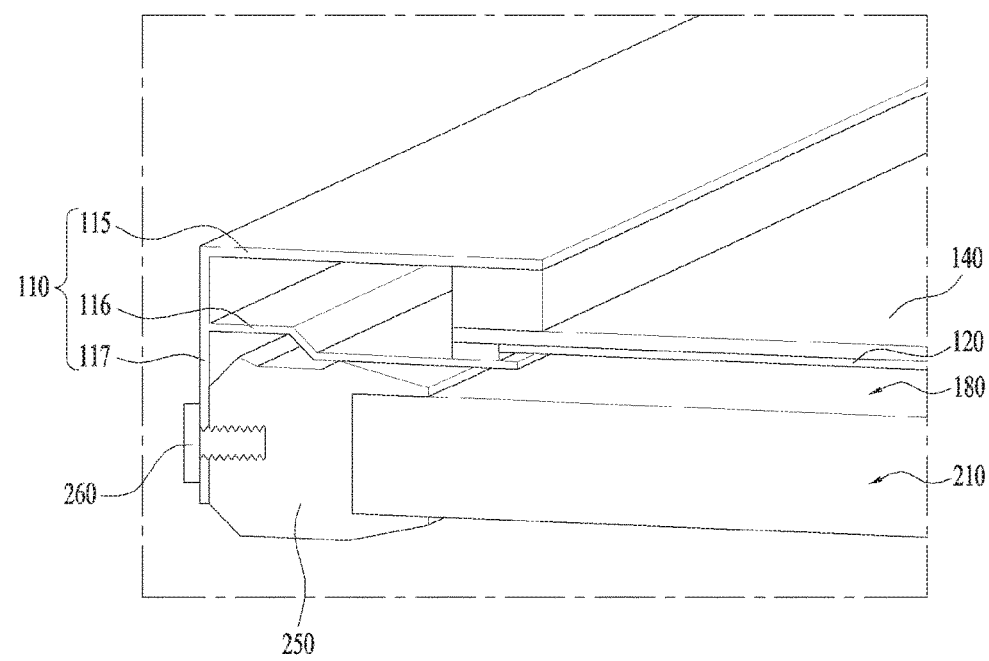
FIG. 5 is a cross-sectional diagram to illustrate a joint mechanism of a transparent display device.

FIG. 5 is a cross-sectional diagram to illustrate a joint mechanism of a transparent display device.

Referring to FIG. 5, in a transparent display device according to the present invention, a transparent display panel 120 may be disposed on a rear surface of a transparent cover 140.

And, an airgap 180 may be formed between a rear surface of the transparent display panel 120 and a front surface of a door unit 210 of a prescribed product.

A frame 110 may include an inner frame 116 coming into contact with a rim of the door unit 210 of the prescribed product and an outer frame 115 disposed by being spaced apart from the inner frame 116.

Herein, the inner frame 116 is attached to the rim of the transparent cover 140 and the outer frame 115 may be spaced apart from the transparent cover 140.

In this case, an IR (infrared) touch sensor 150 is disposed between the outer frame 115 and the transparent cover 140, thereby sensing a user's touch.

And, a wiring configured to electrically connect a control module 130 and the transparent display panel 120 may be disposed between the inner frame 116 and the outer frame 115.

The frame 110 including the inner frame 116 and the outer frame 115 may further include an extending frame 117 extending from end portions of the inner and outer frames 116 and 115 in a direction of the door unit of the prescribed product.

Herein, the extending frame 117 may be jointed and fixed to a lateral surface of a cooler door frame 250 of the door unit by a joint screw 260.

Namely, the extending frame 117 extending from the rim of the frame 110 in the direction of the door unit 210 of the prescribed product 200 can be jointed with the lateral surface of the rim of the door unit 210 of the prescribed product 200.

In some cases, the frame 110 of the transparent display device may be jointed by a mechanism of forming a multitude of joint recesses and a multitude of joint projections at the frame 110 and the cooler door frame 250 and then combining them with each other as well as by the joint mechanism using the joint screw 260.

Figure 6A:
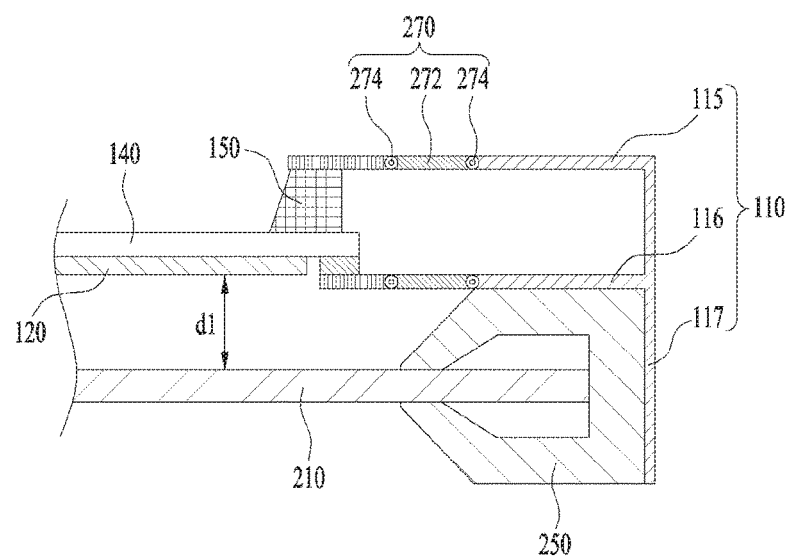
FIG. 6A and FIG. 6B are cross-sectional diagrams to illustrate a gap adjusting unit of a transparent display device according to the present invention.
Figure 6B:
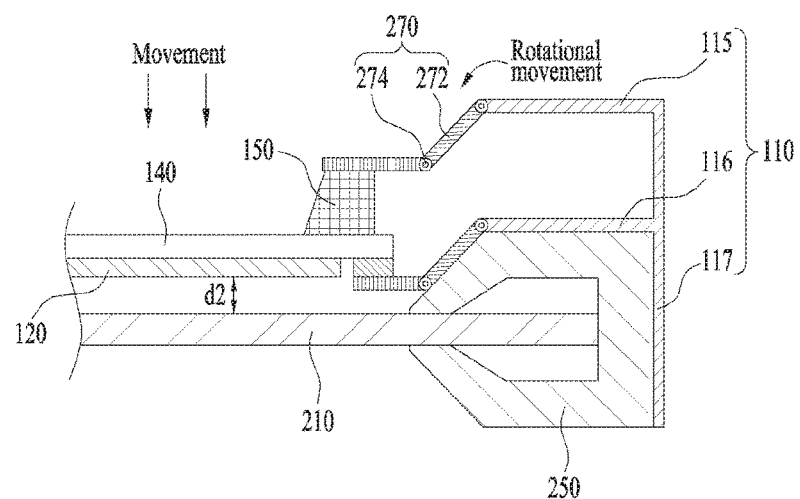

FIG. 6A and FIG. 6B are cross-sectional diagrams to illustrate a gap adjusting unit of a transparent display device according to the present invention. FIG. 6A shows a case that a gap between a transparent display panel and a door unit is maximal, and FIG. 6B shows a case that a gap between a transparent display panel and a door unit is minimal.

Referring to FIG. 6A and FIG. 6B, an airgap may be formed between a rear surface of a transparent display panel 120 and a front surface of a door unit 210 of a prescribed product.

The reason for this is that as the transparent display panel 120 may be adversely affected by humidity generated due to a temperature difference between the transparent display panel 120 and the door unit 210 of the product, durability of the transparent display panel 120 can be degraded.

Herein, the gap between the rear surface of the transparent display panel 120 and the front surface of the door unit of the prescribed product may be variable according to a humidity level within the airgap.

For instance, a gap adjusting unit 270 configured to adjust the gap between the rear surface of the transparent display panel 120 and the front surface of the door unit of the prescribed product may be disposed in the frame 110.

The gap adjusting unit 270 may include an adjusting plate 272 extending from a rim of the frame 110 in a direction of the first opening 111 and a hinge 274 configured to rotationally move the adjusting plate 272 in a direction of the door unit 210 of the prescribed product.

Herein, in response to a control signal of the control module, the gap adjusting unit can 270 adjust the gap between the rear surface of the transparent display panel 120 and the front surface of the door unit 210 of the prescribed product.

For instance, a humidity sensor configured to sense humidity within the airgap 180 may be disposed in the frame 110. And, the control module can control the gap adjusting unit 270 by receiving a sensing signal of the humidity sensor.

Namely, if the humidity within the airgap is high, the controller module controls the gap adjusting unit 270 to increase the gap into a maximum gap d1. If the humidity within the airgap is low, the controller module controls the gap adjusting unit 270 to decrease the gap into a minimum gap d2.

Therefore, the present invention prevents the transparent display panel 120 from being adversely affected by humidity, thereby enhancing durability.

Figure 7:
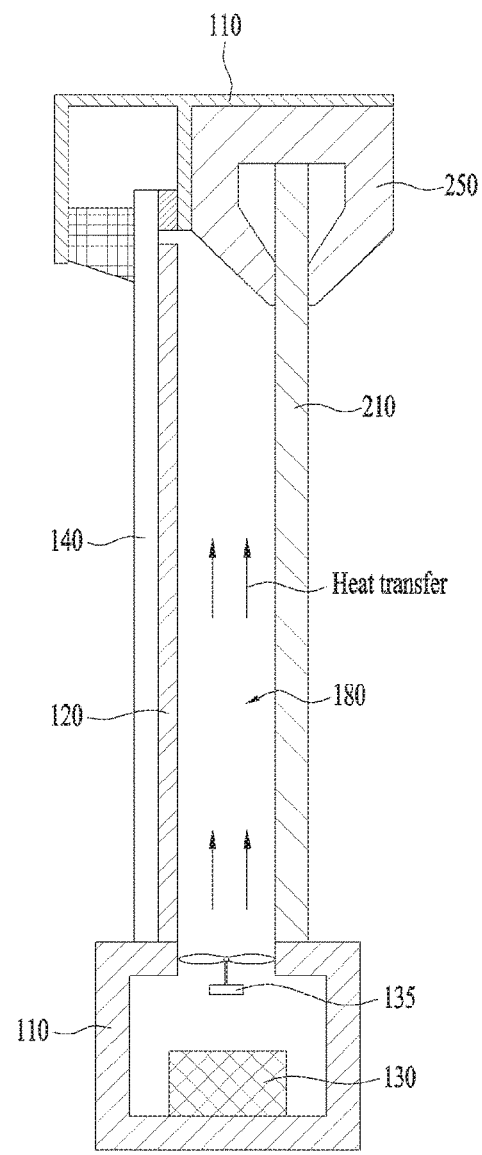
FIG. 7 is a cross-sectional diagram to illustrate a ventilating unit of a transparent display device according to the present invention.

FIG. 7 is a cross-sectional diagram to illustrate a ventilating unit of a transparent display device according to the present invention.

Referring to FIG. 7, a transparent display panel 120 and a transparent cover 140 may be disposed in a first opening of a frame 110, and a control module 130 configured to control the transparent display panel 120 may be disposed in a second opening of the frame 110.

Herein, an airgap may be formed between a rear surface of the transparent display panel 120 and a front surface of a door unit 210 of a prescribed product.

The reason for this is that as the transparent display panel 120 may be adversely affected by humidity generated due to a temperature difference between the transparent display panel 120 and the door unit 210 of the product, durability of the transparent display panel 120 can be degraded.

Hence, a ventilating unit 135 configured to discharge heat generated from the control module 130 into the space between the rear surface of the transparent display panel 120 and the front surface of the door unit of the prescribed product may be disposed in the second opening of the frame 110.

Herein, the ventilating unit 135 enables air with heat to flow into the space between the rear surface of the transparent display panel 120 and the front surface of the door unit 210 of the prescribed product, thereby removing humidity within the airgap 180.

For instance, a humidity sensor configured to sense humidity within the airgap 180 may be disposed in the frame 110. The control module 130 can control the ventilating unit 135 by receiving a sensing signal of the humidity sensor.

Therefore, the present invention prevents the transparent display panel 120 from being adversely affected by humidity, thereby enhancing durability.

Figure 8:
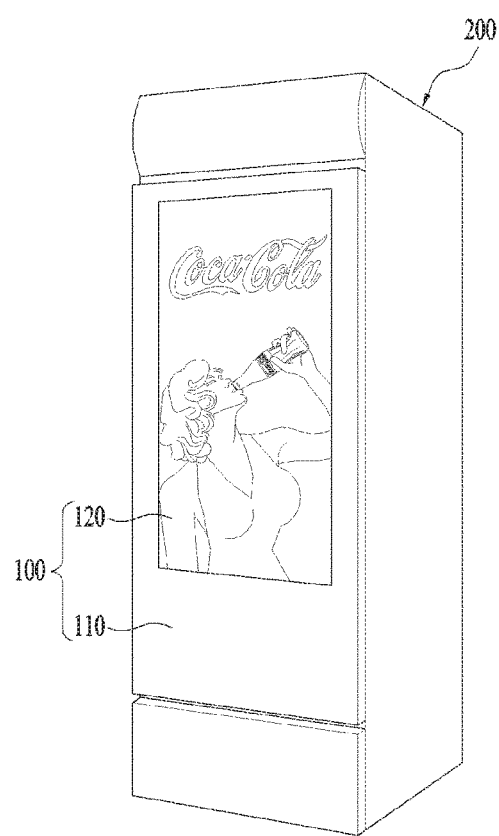
FIGS. 8 to 10 are diagrams to illustrate a cooler to which a transparent display device according to the present invention is attached.
Figure 9:
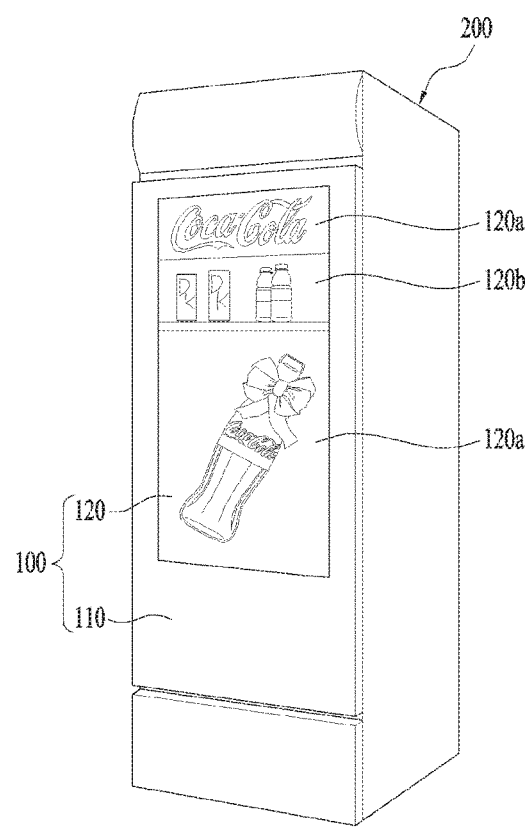
Figure 10:
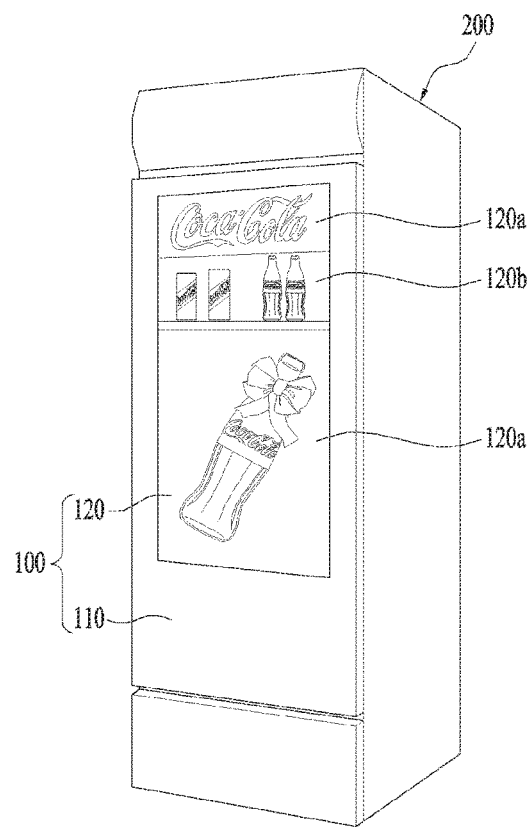

FIGS. 8 to 10 are diagrams to illustrate a cooler to which a transparent display device according to the present invention is attached.

Referring to FIGS. 8 to 10, a display device 100 according to the present invention may include a frame 110 in which a transparent display panel 120 and a control module are installed. The frame 110 of the display device 100 may be installed on a front surface of a door unit of a product 200 such as a cooler or the like.

Herein, as shown in FIG. 8, the control module can control the transparent display panel 120 to display information related to goods stored in a door unit of the cooler.

For instance, if prescribed beverages are disposed in the cooler, the transparent display panel 120 displays various informations and images (photos, videos, etc.) related to the beverages, which can be utilized for advertisement, public relations and the like.

And, the transparent display device 100 may provide various informations by sensing a user's touch input through an infrared (IR) touch sensor and the like.

In some cases, the transparent display device 100 may include a camera and provide various informations by sensing a user's gesture action through the camera.

Referring to FIG. 9, the control module may control the transparent display panel 120 to simultaneously display a transmissive region 120b for transmitting light and a non-transmissive region 120a for not transmitting light.

In doing so, the transparent display panel 120 may enable the goods in the cooler to be viewable through the transmissive region 120b for transmitting light and also enable the goods in the cooler not to be viewable through the non-transmissive region 120a for not transmitting light.

Namely, a user may partially view the goods in the cooler through the transparent display panel 120.

In doing so, the transparent display panel 120 may enable the goods in the cooler to be sequentially viewed as a location the transmissive region 120b for transmitting light moves according to a time.

For instance, in the transparent display panel 120, the transmissive region 120b for transmitting light may move regularly in a predetermined direction or may move irregularly in various directions.

As the transmissive region 120b for transmitting light moves, the user can dynamically view portions of the goods in the cooler so as to be focused on the goods. Therefore, effects of advertisement and public relations are excellent.

Alternatively, the transparent display panel 120 may enable the goods in the cooler to be viewed through the transmissive region 120b for transmitting light and also display various advertisement images related to the goods in the cooler through the non-transmissive region 120 for not transmitting light.

Namely, a user may view the advertisement image related to the goods in the cooler as soon as view the goods in the cooler, through the transparent display panel 120.

Alternatively, the transparent display panel 120 may enable all the goods in the cooler to be viewed through the transmissive region 120b for transmitting light, which corresponds to the whole transparent display panel 120, and also display various advertisement images related to the goods in the cooler.

Alternatively, the transparent display panel 120 may enable all the goods in the cooler to be viewed through the transmissive region 120b for transmitting light, which corresponds to the whole transparent display panel 120, and also display various advertisement images related to the goods in the cooler through the transmissive region 120b at a partially designated location only.

Thus, as shown in FIG. 9, the control module of the display device 100 can control the transparent display panel 120 to display the information related to the goods stored in the door unit of the prescribed product 200 on the non-transmissive region 120a.

Moreover, referring to FIG. 10, the control module of the transparent display device 100 may control the transparent display panel 120 to display information related to the goods viewed through the transmissive region 120b among the goods stored in the door unit of the prescribed product 200 on the non-transmissive region 120a.

In this case, the transparent display panel 120 may enable the goods in the cooler to be viewed through the transmissive region 120b for transmitting light and also display various advertisement images related to the goods in the cooler through the non-transmissive region 120a for not transmitting light. In doing so, the goods displayed on the non-transmissive region 120a may be limited to the goods viewed through the transmissive region 120b only.

Namely, a user may view the viewable real goods and the advertisement image related to the real goods through the transparent display panel 120.

Accordingly, the present invention achieves simple installation and separation of a display device, facilitation of part replacement and mass production by detachably attaching a frame having a transparent display panel and control module disposed thereon to a front surface of a door unit of a prescribed product.

Moreover, the present invention achieves excellent advertisement and public relations effects of goods within a transparent display device installed product by displaying information and images (photos, videos, etc.) related to the goods.

MODE FOR INVENTION

It will be appreciated by those skilled in the art that a transparent display device disclosed in the present specification can be specified into other form(s) by selectively combining all or some of the respective embodiments instead of being limited by the configurations and methods of the former embodiments.

Meanwhile, a method of operating a transparent display device disclosed in the present specification can be implemented with processor-readable codes in a processor-readable recording medium provided to a network device. The processor-readable medium may include all kinds of recording devices capable of storing data readable by a processor. The processor-readable medium may include one of ROM, RAM, CD-ROM, magnetic tapes, floppy discs, optical data storage devices, and the like for example and also include such a carrier-wave type implementation as a transmission via Internet. Furthermore, as the processor-readable recording medium is distributed to a computer system connected via network, processor-readable codes can be saved and executed according to a distributive system.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents. And, such modifications should not be individually understood from the technical idea or prospect of the present specification.

INDUSTRIAL APPLICABILITY

The present invention relates to a transparent display device for displaying information and advertisement of goods in a product and the like by being detachably attached to a prescribed product. Therefore, the present invention has industrial applicability.

What is claimed is:

1. A transparent display device, comprising:
   a frame including a first opening and a second opening;
   a transparent display panel disposed on the first opening of the frame; and
   a control module configured to control the transparent display panel and disposed on the second opening of the frame,
   wherein the transparent display device is detachable from a door unit of a prescribed product,
   wherein the frame comprises:
   a rim frame located around the first opening and the second opening; and
   an extending frame extending from the rim frame in a rearward direction,
   wherein the transparent display device further comprises a fastener configured to detachably couple the extending frame and a lateral surface of the door unit of the prescribed product, and
   wherein a gap adjusting unit configured to adjust a gap between a rear surface of the transparent display panel and the front surface of the door unit of the prescribed product is disposed in the frame.

2. The transparent display device of claim 1, wherein a size of the first opening of the frame is different from that of the second opening.

3. The transparent display device of claim 1, wherein a transparent cover is disposed in front of the first opening of the frame and wherein a non-transparent cover is disposed in front of the second opening of the frame.

4. The transparent display device of claim 3, wherein a rear surface of the transparent cover comes into contact with a front surface of the transparent display panel.

5. The transparent display device of claim 3, wherein a rear surface of the transparent cover is disposed in a manner of being spaced apart from a front surface of the transparent display panel.

6. The transparent display device of claim 5, wherein a transparent adhesive is disposed between the rear surface of the transparent cover and the transparent display panel.

7. The transparent display device of claim 6, wherein the transparent adhesive is disposed on an edge of the front surface of the transparent display panel.

8. The transparent display device of claim 3, wherein an anti-reflective (AR) coating layer is formed on a front surface of the transparent cover.

9. The transparent display device of claim 1, wherein an airgap is formed between a rear surface of the transparent display panel and the front surface of the door unit of the prescribed product.

10. The transparent display device of claim 1, the gap adjusting unit comprising:
    an adjusting plate extending from the rim of the frame in a direction of the first opening; and
    a hinge configured to connect a space between the adjusting plate and the frame and rotationally move the adjusting plate in the direction of the door unit of the prescribed product.

11. The transparent display device of claim 1, wherein a ventilating unit configured to discharge heat generated from the control module into a space between a rear surface of the transparent display panel and the front surface of the door unit of the prescribed product is disposed in the second opening of the frame.

12. The transparent display device of claim 1, the frame, comprising:
    an inner frame coming into contact with the rim of the door unit of the prescribed product; and
    an outer frame disposed in a manner of being spaced apart from the inner frame.

13. The transparent display device of claim 12, wherein the inner frame is attached to a rim of a transparent cover covering the first opening and wherein the outer frame is spaced apart from the transparent cover.

14. The transparent display device of claim 13, wherein an infrared touch sensor is disposed between the outer frame and the transparent cover.

15. The transparent display device of claim 12, wherein a wiring connecting the control module and the transparent display panel electrically is disposed between the inner frame and the outer frame.

16. The transparent display device of claim 1, wherein the control module controls the transparent display panel to display information related to goods stored in the door unit of the prescribed product.

17. The transparent display device of claim 1, wherein the control module controls the transparent display panel to simultaneously display a transmissive region capable of transmitting light and a non-transmissive region incapable of transmitting light.

18. The transparent display device of claim 17, wherein the control module controls the transparent display panel to display information related to goods stored in the door unit of the prescribed product on the non-transmissive region.

19. The transparent display device of claim 17, wherein the control module controls the transparent display panel to display information related to goods viewable through the transmissive region on the non-transmissive region.

* * * * *